(12) United States Patent
Cheng et al.

(10) Patent No.: US 7,972,153 B1
(45) Date of Patent: Jul. 5, 2011

(54) ELECTRICAL CONNECTOR ASSEMBLY HAVING PICK-UP CAP WITH RECESS RECEIVING THE CONTACTS

(75) Inventors: Andrew Cheng, Tu-Cheng (TW); Chih-Pi Cheng, Tu-Cheng (TW); Chia-Wei Fan, Tu-Cheng (TW)

(73) Assignee: Hon Hai Precision Ind. Co., Ltd., Taipei (TW)

( * ) Notice: Subject to any disclaimer, the term of this patent is extended or adjusted under 35 U.S.C. 154(b) by 0 days.

(21) Appl. No.: 12/882,205

(22) Filed: Sep. 15, 2010

(51) Int. Cl.
*H01R 13/44* (2006.01)
(52) U.S. Cl. ........................................ 439/135; 439/940
(58) Field of Classification Search .................. 439/135, 439/940, 41
See application file for complete search history.

(56) References Cited

U.S. PATENT DOCUMENTS

| | | | |
|---|---|---|---|
| 5,860,817 A * | 1/1999 | Fieberling et al. | 439/81 |
| 6,439,901 B1 * | 8/2002 | Ji et al. | 439/135 |
| 6,905,353 B2 * | 6/2005 | Ma et al. | 439/135 |
| 7,632,115 B1 * | 12/2009 | Polnyi | 439/135 |
| 7,828,565 B2 * | 11/2010 | Ma et al. | 439/135 |
| 7,866,985 B2 * | 1/2011 | Hsu | 439/41 |
| 7,883,345 B2 * | 2/2011 | Yeh et al. | 439/135 |
| 2007/0249194 A1 * | 10/2007 | Liao | 439/135 |
| 2008/0188103 A1 * | 8/2008 | Liao | 439/135 |
| 2010/0087087 A1 * | 4/2010 | Yeh | 439/493 |

* cited by examiner

*Primary Examiner* — Gary F. Paumen
(74) *Attorney, Agent, or Firm* — Andrew C. Cheng; Wei Te Chung; Ming Chieh Chang

(57) ABSTRACT

An electrical connector assembly (100) comprises an insulative housing (3), a plurality of contacts (2) received in the insulative housing (3) and a pick-up cap (1) assembled to the insulative housing (3), the contact (2) comprises a base portion (20), a contacting portion (21) extending upwardly from the base portion (20) and a rear portion (23) extending downwardly from the base portion (20), the pick-up cap (1) comprises a flat body portion (10), the body portion (10) comprises an upper surface (101) and a lower surface (102) opposite to each other, the lower surface (102) is supported by the insulative housing (3), a receiving space (1020) recesses from the lower surface (102), and the contacting portions (21) of said contacts (2) project beyond the lower surface (102) into the receiving space (1020).

16 Claims, 7 Drawing Sheets

ELECTRICAL CONNECTOR ASSEMBLY
HAVING PICK-UP CAP WITH RECESS
RECEIVING THE CONTACTS

BACKGROUND OF THE INVENTION

1. Field of the Invention

The present invention relates to an electrical connector assembly, and more particularly to an electrical connector assembly with a pick-up cap having recess at the bottom surface for receiving the contacting portions of the contacts.

2. Description of the Prior Art

U.S. Pat. No. 6,905,353 issued to Ma on Jun. 14, 2005 discloses a conventional electrical connector assembly for electrically connecting an IC package to a printed circuit board. The electrical connector assembly comprises an insulative housing with a plurality of contacts received therein and a pick-up cap assembled thereon. The insulative housing comprises a bottom wall and four side walls extending upwardly from the bottom wall. The side wall comprises a step. The contacts each comprises a contacting portion extending beyond the top surface of the bottom wall. The pick-up cap comprises a plate body portion and a plurality of hooks extending downwardly from the body portion. The lower surface of the body portion is supported by the step and the hooks hook with the insulative housing to secure the pick-up cap on the insulative housing The contacting portions of the contacts are lower than the top surface of the step, that is to say the pick-up cap can not touch the contacts, which can protect the contacts from being damaged by the pick-up cap. Thus, the height of the step must be high enough to support the pick-up cap to a certain height. So, the height of the whole electrical connector assembly is also limited.

Therefore, it is needed to find a new electrical connector assembly having an improved pick-up cap to overcome the problems mentioned above.

SUMMARY OF THE INVENTION

Accordingly, an object of the present invention is to provide an electrical connector assembly having a pick-up cap with recess for receiving the contacts to reduce the height of the electrical connector assembly.

In order to achieve the object set forth, an electrical connector assembly comprises an insulative housing, a plurality of contacts received in the insulative housing and a pick-up cap assembled to the insulative housing, the contact comprises a base portion, a contacting portion extending upwardly from the base portion and a rear portion extending downwardly from the base portion, the pick-up cap comprises a flat body portion, the body portion comprises an upper surface and a lower surface opposite to each other, the lower surface is supported by the insulative housing, a receiving space recesses from the lower surface, and the contacting portions of said contacts project beyond the lower surface into the receiving space.

DESCRIPTION OF PREFERRED EMBODIMENT

Reference will now be made to the drawings to describe the present invention in detail.

Figure 1:
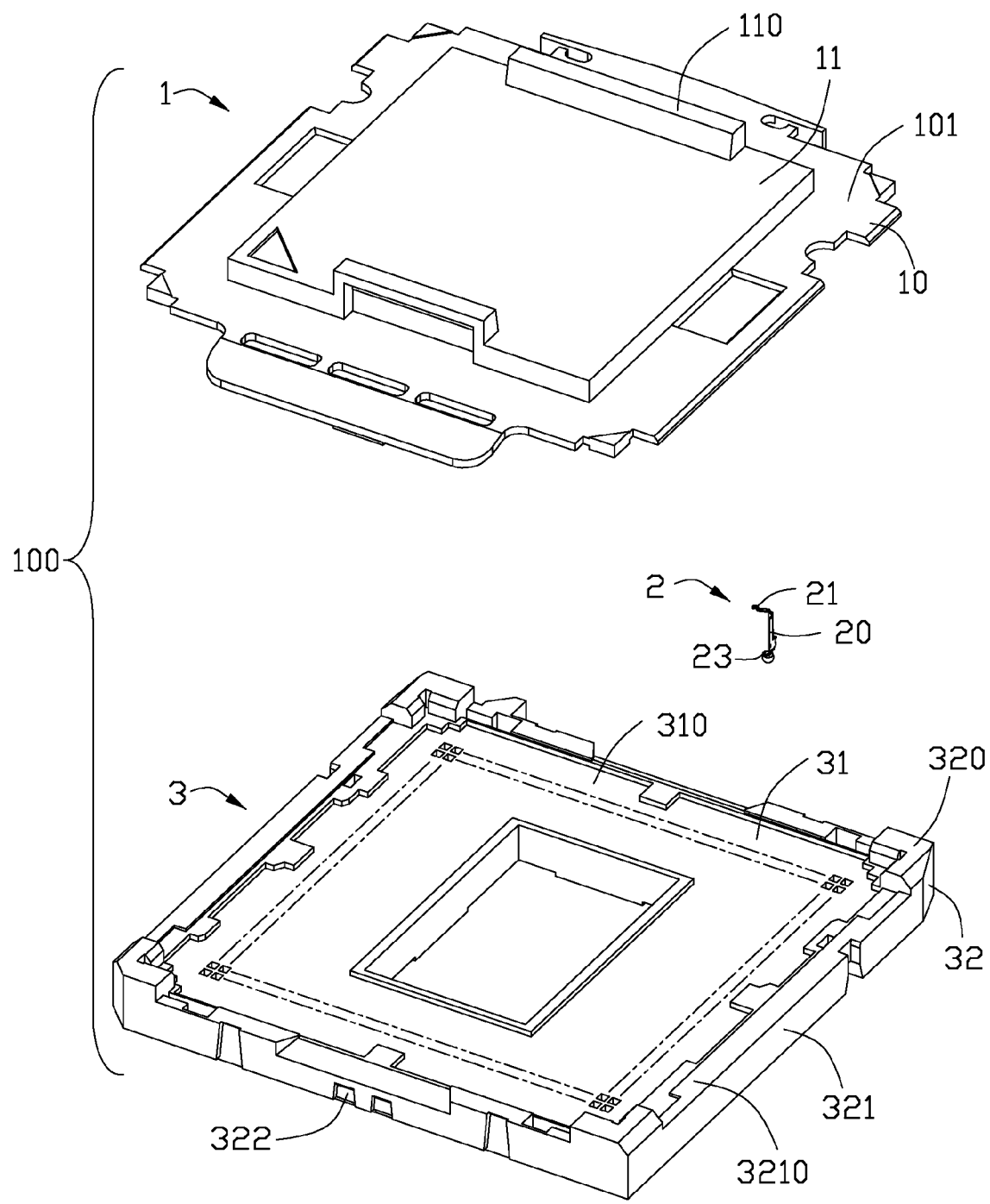
FIG. 1 is an exploded view of the electrical connector assembly according to the present invention.
Figure 2:
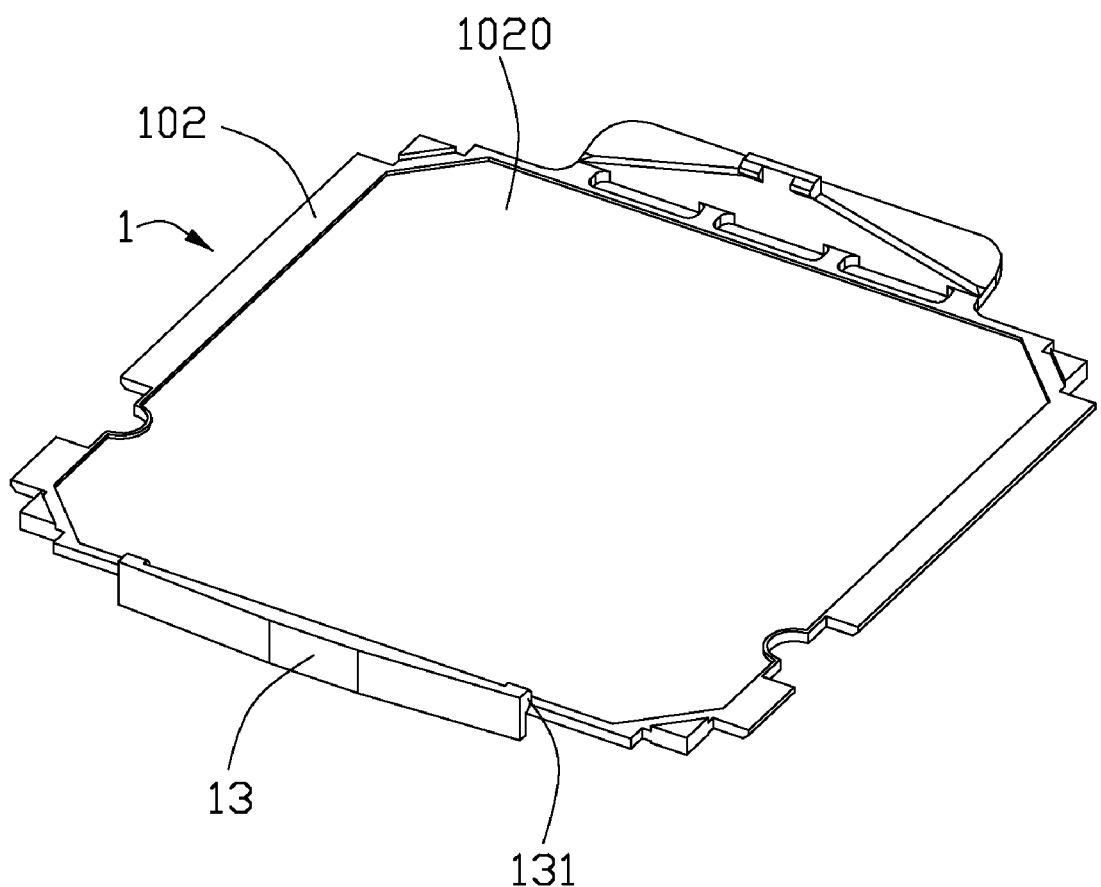
FIG. 2 is a bottom view of the pick-up cap shown in FIG. 1.

Referring to FIGS. 1-2, the electrical connector assembly 100 is used to electrically connecting an IC package (not shown) to a printed circuit board (not shown) and comprises an insulative housing 3, a plurality of contacts 2 received in the insulative housing 3 and a pick-up cap 1 assembled to the insulative housing 3.

The insulative housing 3 comprises a bottom wall 31 and four side walls 32 extending upwardly from the bottom wall 31. The bottom wall 31 and the four side walls 32 form a space 310 to receive the IC Package. The side walls 32 each comprises a top surface 320 and a step 321 depressed from the top surface 320. The step 321 defines a supporting surface 3210 lower than the top surface 320 of the side wall 32. A pair of recesses 322 is formed on two steps 321.

The contacts 2 are received in the bottom wall 31 of the insulative housing 3 and each comprises a base portion 20 secured in the insulative housing 3, a contacting portion 21 extending upwardly from the base portion 20 and a rear portion 23 extending downwardly from the base portion 20. The contacting portions 21 extend into the space 310 to contact with the IC package.

The pick-up cap 1 comprises a flat body portion 10, a suck portion 11 extending upwardly from the body portion 10 and a pair of latches 13 extending downwardly from opposite ends of the body portion 10. The latches 13 each comprise a pair of hooks 131. The suck portion 11 forms a smooth surface used to be sucked by a tool to move the electrical connect assembly 100 and a pair of grab portions 110 protruding upwardly from the smooth surface. In used, operator grabs the grab portions 110 to move the pick-up cap 1. The body portion 10 comprises an upper surface 101 and a lower surface 102 opposite to each other. A receiving space 1020 is recessed from the lower surface 102 to the upper surface 101 and has a substantially similar size with the space 310 of the insulative housing 3. Top surface of the receiving space 1020 is located between the lower surface 102 and the upper surface 101.

Figure 3:
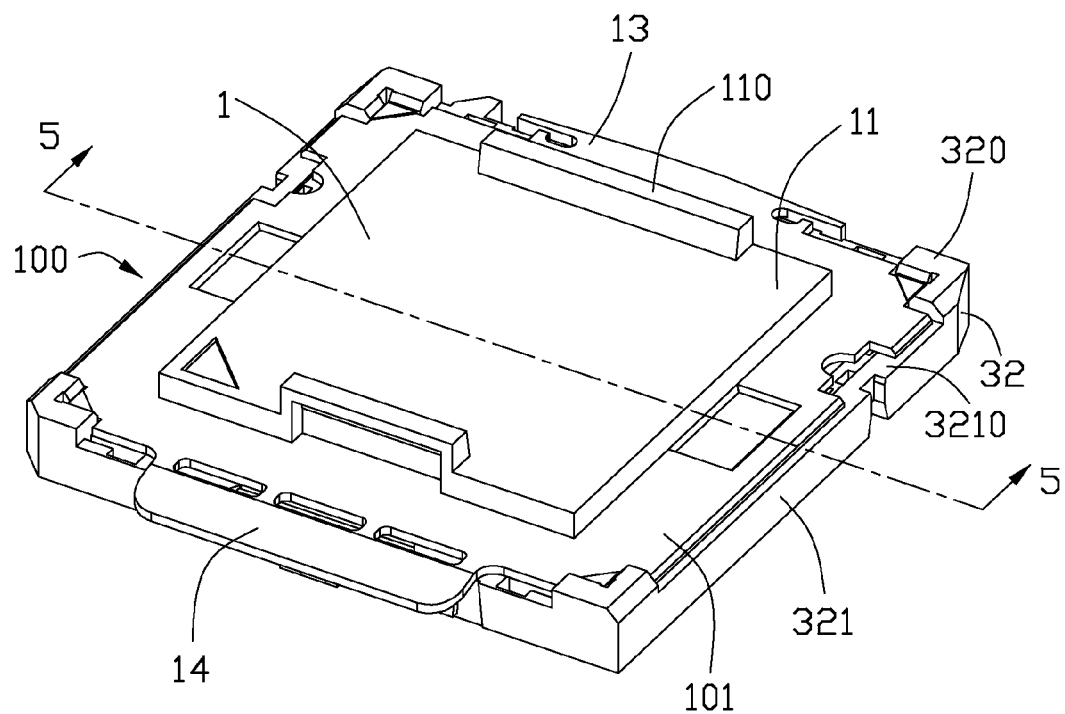
FIG. 3 is an assembled view of the electrical connector assembly shown in FIG. 1.
Figure 4:
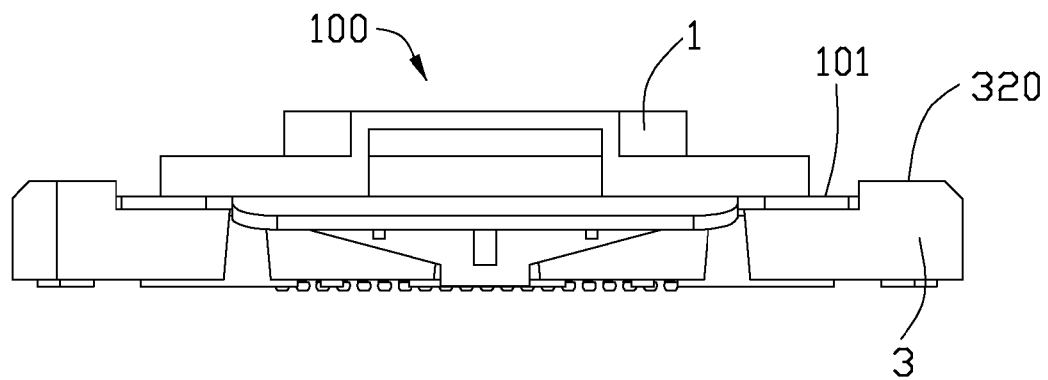
FIG. 4 is a side view of the electrical connector assembly shown in FIG. 3.
Figure 5:
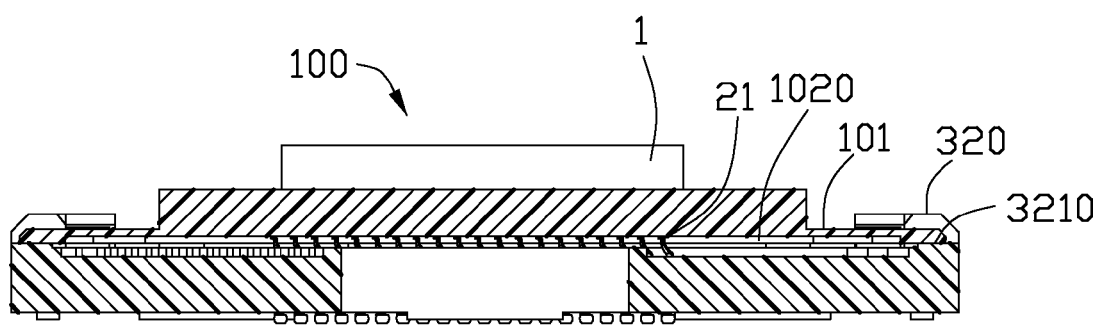
FIG. 5 is a cross-sectional view of the electrical connector assembly taken along line 5-5 in FIG. 3.

Referring to FIGS. 3-5, shown the electrical connector assembly 100 is assembled. The contacts 2 are received in the insulative housing 3 and the contacting portions 21 extend into the space 310. The pick-up cap 1 is assembled to the insulative housing 3. The hooks 131 of the latches 13 are received in the recesses 322 and hook with the insulative housing 3 to secure the pick-up cap 1 on the insulative housing 3.

The lower surface 102 of the pick-up cap 1 is supported by the supporting surface 3210 of the step 32. The upper surface 101 of the body portion 10 is lower than the top surface 320 of the side wall 32. The contacting portions 21 of the contacts 2 are higher than the supporting surface 3210 of the step 32 and are received in the receiving space 1020 of the pick-up cap 1.

Figure 6:
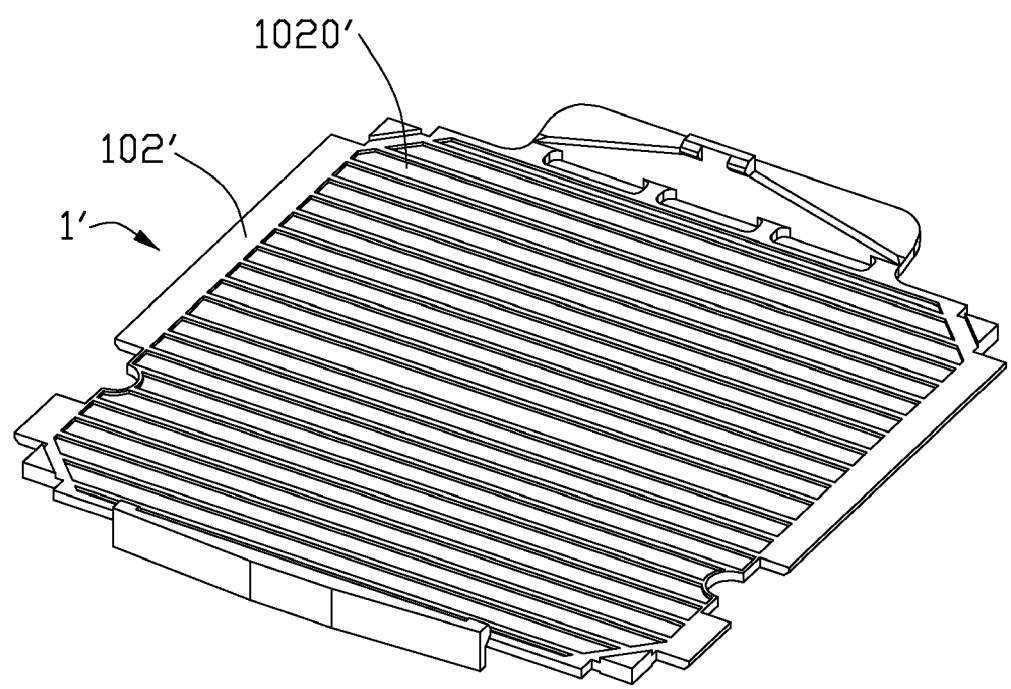
FIG. 6 is a second embodiment of the pick-up cap.
Figure 7:
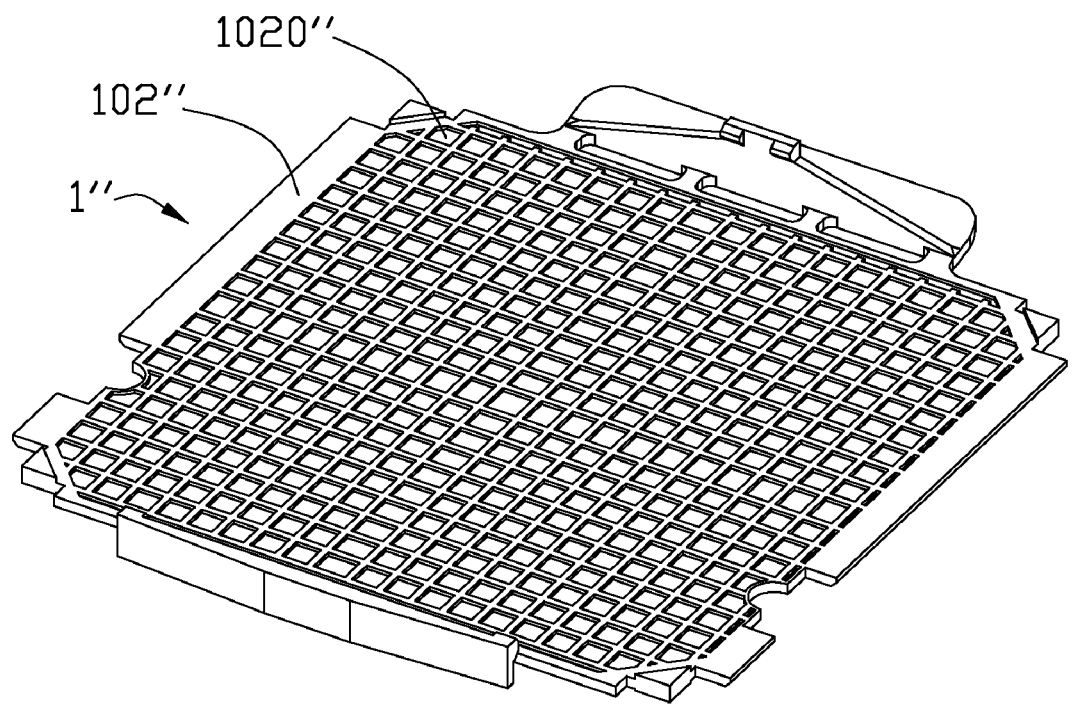
FIG. 7 is a third embodiment of the pick-up cap.

Referring to FIGS. 6-7, shown another two embodiments of the pick-up cap 1. The difference is the lower surface 102' of the pick-up cap 1' in FIG. 6 comprises a plurality of ribs in the corresponding receiving spaces 1020' thereby forms a plurality of sub-receiving space corresponding to rows of the contacts 2 respectively. Each row of contacting portions 21 of the contacts 2 are received in a corresponding sub-receiving space. The receiving space 1020" in FIG. 7 are divided into a plurality of sub-receiving spaces corresponding to the contacts 2 respectively, and the contacting portion 21 of the contact 2 is received in the corresponding sub-receiving space.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly, comprising:
    an insulative housing;
    a plurality of contacts received in the insulative housing and each comprising a base portion, a contacting portion extending upwardly from the base portion and a rear portion extending downwardly from the base portion; and
    a pick-up cap assembled to the insulative housing and comprising a flat body portion, the body portion comprising an upper surface and a lower surface opposite to each other, the lower surface being supported by the insulative housing; wherein
    a receiving space is upwardly recessed from the lower surface, and the contacting portions of said contacts project beyond the lower surface and into the receiving space.

2. The electrical connector assembly as claimed in claim 1, wherein the insulative housing comprises a bottom wall and a plurality of side walls extending upwardly from the bottom wall, and the side wall is recessed from a top surface thereof thereby forming a supporting surface contacting with the lower surface of the pick-up cap.

3. The electrical connector assembly as claimed in claim 2, wherein the upper surface of the body portion of the pick-up cap is lower than the top surface of the side wall of the insulative housing.

4. The electrical connector assembly as claimed in claim 1, wherein the pick-up cap comprises a plurality of ribs in the corresponding receiving space thereby forms a plurality of sub-receiving space corresponding to rows of the contacts respectively.

5. The electrical connector assembly as claimed in claim 1, wherein the receiving space are divided into a plurality of sub-receiving spaces corresponding to the contacts respectively.

6. The electrical connector assembly as claimed in claim 1, wherein the pick-up cap comprises a suck portion extending upwardly from the body portion which defines a smooth surface.

7. The electrical connector assembly as claimed in claim 6, wherein the suck portion comprises a pair of grab portions extending upwardly from the smooth surface.

8. The electrical connector assembly as claimed in claim 1, wherein the pick-up cap comprises at least a latch extending downwardly from the body portion, the latch comprises a pair of hooks to hook with the insulative housing to secure the pick-up cap thereon.

9. An electrical connector assembly, comprising:
    an insulative housing comprising a bottom wall and a plurality of side walls extending upwardly from the bottom wall, the bottom wall and the side walls defining a lower receiving space;
    a plurality of contacts arranged on in the lower receiving space of the insulative housing and comprising a base portion, a contacting portion and a rear portion extending from the base portion; and
    a pick-up cap assembled to the insulative housing and comprising a body portion supported on the side wall of the insulative housing, the body portion comprising an upper surface and a lower surface opposite to the upper surface, the body portion defining an upper receiving space upwardly recessed from the lower surface thereof; wherein
    the upper receiving space is corresponding to the lower receiving space and the contact portions of the contacts project into the upper receiving space.

10. The electrical connector assembly as claimed in claim 9, wherein the upper surface of the body portion of the pick-up cap is lower than the top surface of the side wall of the insulative housing.

11. The electrical connector assembly as claimed in claim 9, wherein the pick-up cap comprises a plurality of ribs paralleled to each other thereby divides the upper receiving space into a plurality of sub-receiving space corresponding to rows of the contacts, respectively.

12. The electrical connector assembly as claimed in claim 9, wherein the upper receiving space is divided into a plurality of sub-receiving spaces corresponding to the contacts, respectively.

13. The electrical connector assembly as claimed in claim 9, wherein the pick-up cap comprises a suck portion extending upwardly from the body portion which defines a smooth surface, the suck portion comprises a pair of grab portions extending upwardly from the smooth surface.

14. The electrical connector assembly as claimed in claim 9, wherein the pick-up cap comprises at least a latch extending downwardly from the body portion, the latch comprises a pair of hooks to hook with the insulative housing to secure the pick-up cap thereon.

15. An electrical connector assembly comprising:
    an insulative housing defining an upward receiving space surrounded by a bottom wall and a periphery wall for receiving an electronic package therein;
    a plurality of contacts disposed in the housing with contacting sections upwardly extending into the receiving space;
    a pick up cap releasably mounted upon the housing and including a supporting plate having thereof a downward face seated upon an upward face of the housing for supporting the pick up cap upon the housing; wherein
    an underside of the supporting plate is formed with a plurality of recesses upwardly recessed from the downward face for respectively receiving tips of the contacting sections of the corresponding contacts therein under condition that said recesses are hidden under an upward face of the supporting plate so as not to be upwardly exposed to an exterior.

16. The electrical connector assembly as claimed in claim 15, wherein some of said recesses are joined together in at least one direction.

* * * * *